United States Patent [19]

Polllock

[11] Patent Number: 5,105,253

[45] Date of Patent: Apr. 14, 1992

[54] STRUCTURE FOR A SUBSTRATE TAP IN A BIPOLAR STRUCTURE

[75] Inventor: Larry J. Polllock, Santa Clara County, Calif.

[73] Assignee: Synergy Semiconductor Corporation, Santa Clara, Calif.

[21] Appl. No.: 634,954

[22] Filed: Dec. 28, 1990

Related U.S. Application Data

[63] Continuation of Ser. No. 291,049, Dec. 28, 1988, abandoned.

[51] Int. Cl.$^5$ .................. H01L 27/04; H01L 27/12
[52] U.S. Cl. ...................... 357/49; 357/71; 357/47; 357/34
[58] Field of Search ............ 357/49, 71 S, 47, 34, 357/50

[56] References Cited

U.S. PATENT DOCUMENTS

| 4,509,249 | 4/1985 | Goto et al. | 357/49 |
| 4,546,538 | 10/1985 | Suzuki | 357/49 |
| 4,621,276 | 11/1986 | Satwinder | 357/71 S |
| 4,666,556 | 5/1987 | Fulton et al. | 357/49 |
| 4,727,046 | 2/1988 | Tuntasood | 357/59 H |
| 4,741,802 | 5/1988 | Okumura | 357/55 |
| 4,819,052 | 4/1989 | Hutter | 357/49 |
| 4,819,054 | 4/1989 | Kawaji et al. | 357/49 |
| 4,924,284 | 5/1990 | Beyer et al. | 357/49 |

FOREIGN PATENT DOCUMENTS 63-276263 11/1988 Japan .
1-99254 4/1989 Japan .

OTHER PUBLICATIONS

"Process for Simultaneously Forming Poly/Epi Silicon Filled Deep and Shallow Isolation Trenches having a CVD Oxide Cap", IBM TDB, vol. 33, No. 7, Dec./1990, pp. 388-392.

Primary Examiner—Andrew J. James
Assistant Examiner—Viet Q. Nguyen
Attorney, Agent, or Firm—Flehr, Hohbach, Test, Albritton & Herbert

[57] ABSTRACT

A substrate tap is incorporated in an integrated circuit which comprises a plurality of transistors formed in isolated device regions in a substrate material comprising a layer of N-type material over a layer of P-type material. The isolated device regions are defined by isolating slots extending down through said N-type material and into the P-type material. The trench for each substrate tap extend down to said P-type material and has an oxide layer lining the sidewalls of trench, a doped polysilicon layer covering the sides and bottom of said trench, and a doped implant or diffused region formed at the base of and in contact between the tap and the substrate. The substrate beneath the devices is connected to a negative potential to isolate the devices on said substrate. Preferably, the substrate tap includes a silicide layer formed over said polysilicon layer to enhance contact to said doped implant region.

6 Claims, 2 Drawing Sheets

STRUCTURE FOR A SUBSTRATE TAP IN A BIPOLAR STRUCTURE

This is a continuation of application Ser. No. 07/291,049 filed Dec. 28, 1988 now abandoned.

CROSS-REFERENCE TO RELATED APPLICATION

The substrate tap and associated process disclosed in this application are especially useful in the formation of devices of the type disclosed in U.S. application Ser. No. 142,032 filed Jan. 11, 1988, entitled HIGH SPEED BIPOLAR MEMORY, assigned to the assignee of this invention and incorporated herein by reference. Details of a complete bipolar process which may incorporate this process may be found in U.S. application Ser. No. 180,626 filed Apr. 11, 1988 entitled PROCESS FOR PRODUCING A HIGH PERFORMANCE BIPOLAR STRUCTURE, also assigned to the assignee of this invention and incorporated herein by reference.

FIELD OF THE INVENTION

This invention relates to high-performance bipolar integrated circuits, and more particularly a ground tap for an integrated circuit, formed without additional masking steps, the resulting circuits occupying a minimum horizontal area and with minimum junction depth.

BACKGROUND OF THE INVENTION

The present trend in semiconductor technology is toward large scale integration of devices with very high speed and low power performance. The parameters that are essential to such high performance bipolar transistors include the presence of low parasitic capacitances as realized by shallow vertical junctions, and small horizontal geometries. In other words, it is necessary to make the devices in the integrated circuits as small as possible in both the horizontal and vertical directions.

One approach developed to reduce the size of integrated circuits is the use of trench or slot isolation to isolate adjacent bipolar structures. This technique incorporates etching grooves into the semiconductor wafers adjacent to those regions in which PN junctions are to be formed. Thus, the substrate layers are made relatively shallow in order to minimize the depth to which the groove must be etched.

Also in such devices, it is important to be able to form a substrate tap; that is, a contact from the substrate to the most negative potential available, typically the negative side of the power supply. In a typical bipolar device, the substrate is a P-type material formed with a buried layer of N+ material and an N-type epi region on top. The active devices will be formed in tubs; i.e., isolated regions of the N-type epi material. By tying the substrate to the most negative potential in the circuit, the P-type substrate is negatively biased, which will reverse bias all the N-epi tubs. The N+ buried layers and the N-type epi tubs will be more positively biased, i.e., a more positive potential than the substrate, thereby isolating the tubs one from another.

Tying the substrate to the most negative potential in the circuit means that the PN junctions formed by the P substrate and the N-type buried layer are reverse biased. In this way, isolation is maintained on the floor of all devices by what are essentially reverse biased diodes.

An example of the importance of this follows from considering the effect of having bipolar memory elements that include, for example, lateral PNP transistors that can inject current into the substrate through the parallel vertical PNP devices whose collector is the substrate. The circuit designer needs to keep the substrate from biasing or floating upward. The more negative the substrate is with respect to the active devices, the less capacitance is present. This is because of the isolation provided by the depletion region of the P substrate, which widens with higher levels of reverse bias, where the buried layer is reversed biased with respect to the P-type substrate. The depletion region of the P substrate is acting as an insulator, as the PN junction between the substrate and the buried layer is reverse biased.

Returning to the example of a bipolar memory using lateral PNP loads, such a lateral PNP has horizontally adjacent P, N and P regions. Holes are injected from the P-type emitter of the memory cell into the N-epi base of the lateral PNP; the P-type substrate can act as a parallel collector and collect holes as well as the adjacent lateral P-type collector. The buried layer is provided to suppress the vertical injection of hole currents into the substrate. If a large memory array has been formed, and the cells, collectively, are permitted to inject current into the substrate, a large cumulative current can be created in the substrate. This injected charge must be carried off, or the P-type substrate will drift up to such an extent that the array essentially has forward bias across the PN junctions. In this forward bias condition, the entire array can essentially cease functioning. Maintaining the depletion region as wide as possible at the PN junction between the substrate and the buried layer by carrying off the injected charge is essential in minimizing collector-substrate capacitance. In the absence of successfully tying the substrate to the most negative point in the circuit, the substrate can forward bias, and as it forward biases N-type epi tubs nearer to Vcc, parasitic lateral NPN devices can also turn on. This can induce several kinds of phenomena, ranging from minor performance degradation to functional failure and/or latch-up.

A related problem, in the absence of successfully tying the substrate to the point of negative potential, is that the substrate is floating and it is possible to capacitively couple AC signals into the substrate. This injection of carriers can cause cross-talk to critical circuit nodes which can cause serious problems ranging from loss of noise immunity to the circuit breaking into oscillations.

The ability to tie the substrate to the point of most negative potential is also essential in forming TTL devices.

While this problem has previously been recognized, the substrate taps known in the art largely relied on additional masking steps to form the tap. Typically, the buried layer is masked to define a region through the N epi and the N buried layer. Then a slug of P-type material is defined through the buried layer to the substrate, so that a contact can be formed via this P-type slug to the P-type substrate.

SUMMARY OF THE INVENTION

An objective of the invention is to provide a ground tap which may be incorporated into a bipolar process without additional masking steps.

Another objective of this invention to more easily and efficiently define a ground tap to the substrate.

A related invention is to provide a process in which a contact may be formed to the substrate of a bipolar device without the use of additional masking steps in the bipolar processing disclosed in the above referenced applications.

According to the present invention, a substrate tap is incorporated in an integrated circuit which comprises a plurality of transistors formed in isolated device regions in a substrate material comprising a layer of N-type material over a layer of P-type material. The isolated device regions are defined by isolating slots extending down through said N-type material and into the P-type material. The trench for each substrate tap extend down to said P-type material and has an oxide layer lining the sidewalls of trench, a doped polysilicon layer covering the sides and bottom of said trench, and a doped implant or diffused region formed at the base of and in contact between the tap and the substrate. The substrate beneath the devices is connected to a negative potential to isolate the devices on said substrate. Preferably, the substrate tap includes a silicide layer formed over said polysilicon layer to enhance contact to said doped implant region.

The tap is defined by employing a process wherein beginning with a P-type substrate, a blanket buried layer of N-type material is formed followed by growing an N-type epi layer. Following these steps, the ground or substrate tap is defined by cutting a trench of sufficient width so that a later poly deposition step will not close the trench. This trench is opened simultaneously with the definition of isolating trenches which cut through the sheet buried layer and which are used to define the N-epi tubs in which the active devices will be formed. After the narrow trenches and wider trenches are cut, the substrate surface is oxidized to form a buffer oxide layer. This layer is anisotropically etched to leave oxide along the trench walls, but not on the floor of the trenches and slots. Next, a poly layer is formed which is sufficiently thick to fill the narrower isolation trenches, but is not thick enough to completely fill the wider slots. Either before or after the poly layer is formed on the sides and base of the wide trenches, a P-doped region is formed at the bottom of the wide trench in the substrate so that contact can easily be made through the trench to the substrate. The emitter silicide layer which is an integral part of the process, automatically covers the bottom of the wide trench and makes adequate electrical contact to have substrate tap function.

A major advantage of this approach is that this design for a ground tap, with its attendant processing advantages, provides a wafer which is "unpersonalized" at the buried layer and epi growth phases of the process. This is because the process does not require alignment to the buried layer through epi and its inherent "epi shift". This wafer already incorporating the buried layer and grown epitaxi can be treated as a starting material. This dramatically shortens the cycle time and simplifies the logistics for producing finished products, and eliminates the very critical alignment of buried collection through the epitaxial layer.

The objects, features and advantages of this invention will be better understood with the following description taken in conjunction with the accompanying drawings.

DETAILED DESCRIPTION OF THE DRAWINGS

The ground tap described below and the process for forming it are especially useful in a high performance bipolar device wherein elements are separated by spacers and devices are defined by oxide filled trenches. The ground tap described herein is especially useful as it may be formed without additional masking steps.

Figure 1A:
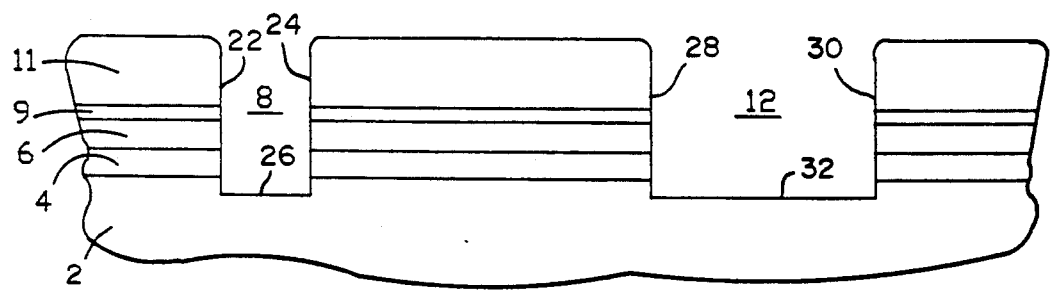
FIG. 1A illustrates the substrate in which the wide slot, as well as the narrower trenches, used to define tubs in which devices will be formed.

The process in an exemplary embodiment which will be described below begins with a P-type 2 substrate shown in FIG. 1A. Then an unmasked buried layer 4 of N-type doping material is formed. Arsenic or antimony are usually used as the dopant. In the process in which the ground tap disclosed herein is especially useful, the buried layer 4 is about 1 $\mu$ thick. However, the ground tap of this invention is also useful with devices using thicker buried layers and epi.

The next layer, atop the buried layer and an unmasked layer, is the epi layer 6. This is an N-doped layer approximately $\frac{3}{2}$ $\mu$ thick. Before any further processing to define the active devices in this substrate, the trenches 8 which will define the tubs 10 in which active devices will be located, are established. According to this invention, the wide trenches or slots 12, that are used to form the ground or substrate tap, can be simultaneously formed with the isolating trench 8.

The process for forming the ground tap trench or slot 12, together with the isolating trench 8, essentially comprises laying down a thin nitride 9 over the epi region 6 and then depositing a thicker oxide 11 over the nitride 9. The oxide 11 is masked and etched, and then a selective silicon etch is performed; that is, an etchant is used which etches silicon faster than oxide (typically a reactive ion etching process). This step is an anisotropic reactive ion etch, etching only in the vertical direction. The etch is designed to reach completely through the epi layer 6 and the buried layer 4 and sufficiently into the substrate 2 to accommodate the voltage requirements of the device.

Figure 1B:
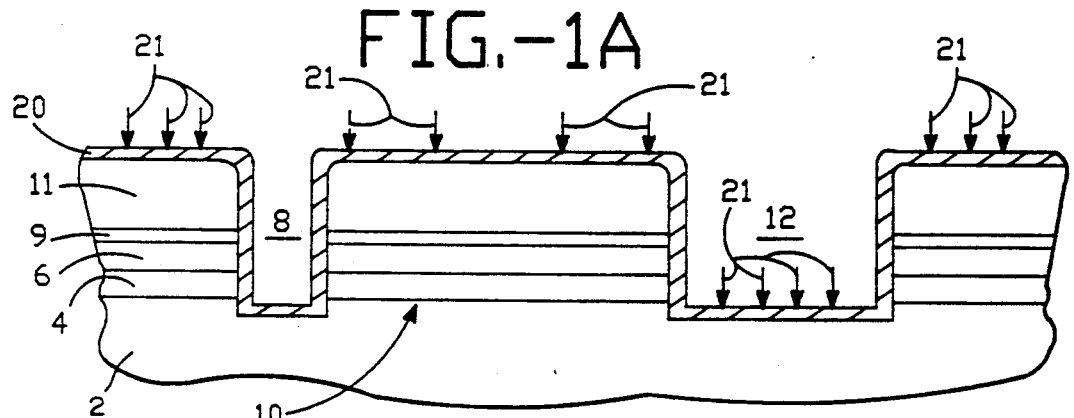
FIG 1B illustrates the result of processing to oxidize and further etch the trenches and slots which have been formed.

After the trenches have been formed, the entire wafer is oxidized (See FIG. 1B) by forming a layer of oxide 20 over the entire exposed surface of the trenches. Thus, the oxide 20 also lines the sidewalls 22, 24 and bottom 26, 32 of the isolating trenches and sidewalls 28, 30 and bottom 32 of the wide substrate tap trench 12.

After the oxide layer 20 is in place, an anisotropic etch represented by arrows 21 is performed to open the bottom surface 26 of the trench and the bottom surface 32 of the slot. This removes the material indicated by the shaded regions of FIG. 1B.

Next, polysilicon 38 is deposited over the entire surface of the wafer. This polysilicon deposition 38 is uniform in thickness and conformal to both vertical and horizontal surfaces, and will completely fill the trench 8 with the exception of a possible indentation 36, which is not significant, at the top of the trench. The polysilicon layer 38 will also uniformly and conformally cover the oxide coating on sidewalls 28, 30 of the wide trench 12, but will not be sufficiently thick to completely fill the wider slot 12. Thus, the groundwork has been laid such that with further processing, a substrate tap can now be created which essentially occurs without additional processing steps, but rather, by proper use of the sequence of steps which must be used to form the isolating trenches between active device tubs.

After the poly fill 38 has been completed, a P+ layer 40 (as indicated by the dashed line) is deposited into the entire surface of the poly including the bottom of the trench 12. The result is that the trench 12 is filled with P+ doped poly but none of the P+ layer 40 has entered the isolating trench 8. To summarize the results of the process to this point, the wide trench 12 is now lined with a thin layer of oxide 20 opened at the bottom, and a thicker layer of poly 38, and an implanted P+ layer 40 now covers the surface of the poly and diffuses uniformly into the poly layer 38 such that the poly layer is conductive throughout the diffused thickness. The diffusion is thick enough to penetrate the bottom 32 of the substrate tap trench forming a conductive path to the P-type substrate 2. However, the P+ layer 40 does not penetrate the isolation trench 8.

Next, a nitride layer 41 is laid down over the polysilicon 40. The presence of this layer 41 will ultimately define limited regions for field oxidation.

Figure 2:
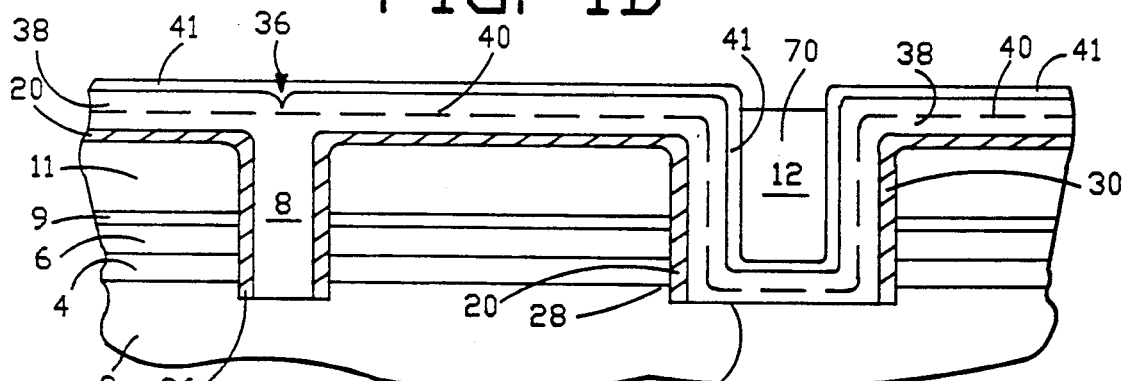
FIG. 2 illustrates the result of processing to open the bottom of the slot and define the slot edges with oxide and P+ poly.
Figure 3:
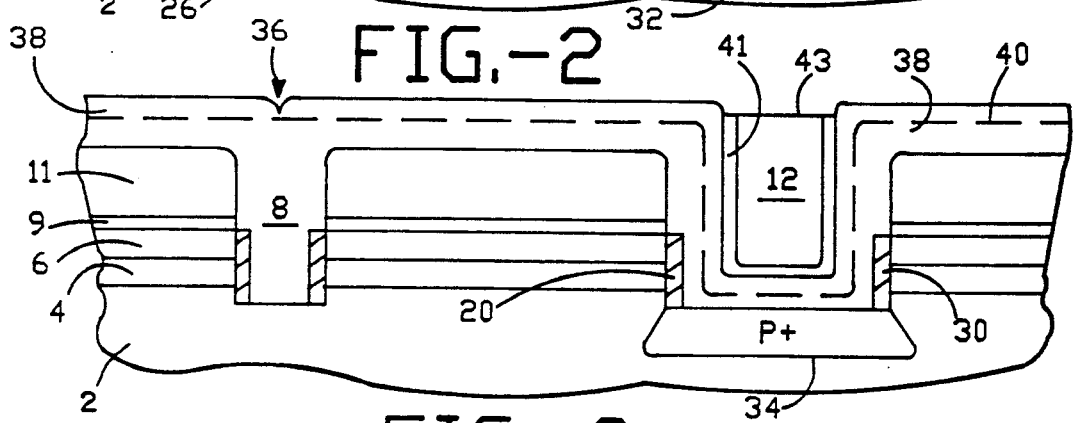
FIG. 3 illustrates the finished ground tap.
Figure 4:
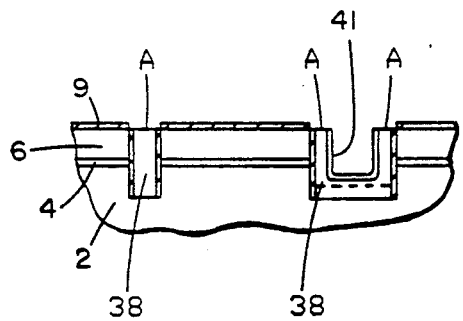
FIG. 4 illustrates the planarized substrate with the slots and trenches fully formed.

To carry out the planarization of the device, photoresist 43 is spun on the surface of the wafer, covering the surface with a smooth, thin viscous film and filling the open trenches 12. Obviously, the photoresist cannot enter the isolating trenches 8, which are now completely filled with poly. The photoresist 11 is planarized to remove it from the nitride surface and leave slots 12 filled with resist, as shown at 70 of FIG. 2. Using this resist 70 to mask the nitride 41 that is deep in the trenches 12, the nitride 41 is now etched off the surface of the polysilicon layer 38, but left in the slot 12 as shown in FIG. 3. The wafer is now planarized by removing all layers (11, 38, and 40) to expose nitride layer 9, as shown in FIG. 4. The slots 12 are now protected by the nitride layer 9 during the field oxidation step defined below.

Figure 6:
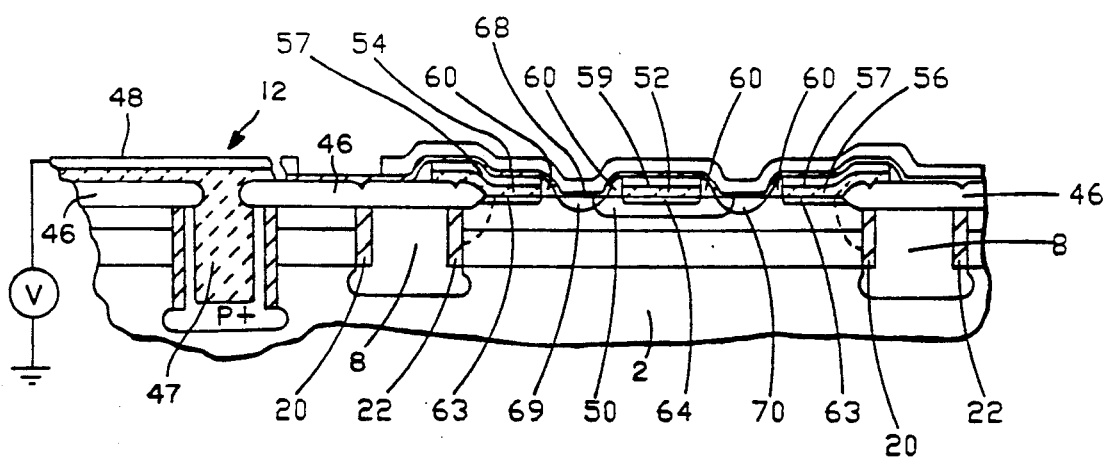
FIG. 6 is a figure taken from the incorporated application showing the active devices in a substrate in which the present invention can easily be incorporated.

It can be seen from a study of FIG. 6 how the formation of this substrate tap 12 fits in with the formation of bipolar devices formed in accordance with the referenced application without additional processing steps Formation of the substrate tap 12 occurs simultaneously with the formation of the trenches 8 with their oxide sidewalls 20, 22, which define the tubs in which the active devices will be formed.

As discussed in detail in the referenced application, the next masking step is to define the field oxide 46 which will surround the active device and isolate the device from adjoining devices, as well as providing an isolating support layer for connections to be formed. Of course, this oxide is masked off by the protective nitride layer 41 so it does not fill the substrate tap 12. More specifically, as shown in FIG. 4, the regions of polysilicon layer 38 left exposed by the limited extent of first nitride layer 9 and the second nitride layer 41 are oxidized to form field oxide regions 46.

Figure 5:
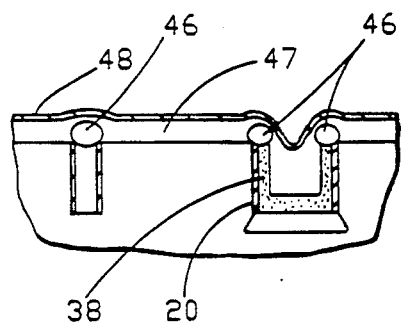
FIG. 5 illustrates the substrate with the oxidized surface and a layer of polysilicon over the surface.

Referring next to FIG. 5, the first nitride layer 9 and the second nitride layer 41 are now stripped off, and layers of polysilicon 47 and silicide 48 are deposited over the surface including the ground tap 12. Resist is again spun on to fill ground tap 12. When the emitter is defined by an arsenic (N+) implant, the implant is blocked from affecting the ground tap by the resist.

The integration of the process for forming the ground tap with the previously disclosed process for forming the transistor is more apparent from inspection of FIG. 6.

After this step, the active base region 50 is formed and the polysilicon emitter and collector contacts 52, 54, 56 are aligned with the base 50. Then a thin silicide layer 57 is formed. This same step can be used to deposit the thin silicide layer 48 which lines the surface of the polysilicon layer of the substrate tap. After this step, the spacers 60 are defined adjacent the emitter and collector. The subsequent heating steps will define the active collector 63 and emitter 64 by diffusion of the dopant from the lower poly 52, 54, 56 into the underlying substrate. The upper layer of poly 68 is then laid down and heating will define the regions 69, 70 creating contact between the upper poly material and the active intrinsic base 50. When contacts are formed to the poly layer discussed above, contacts can also be established to the substrate tap 12 and led out to the negative power supply to provide the desired contact between the substrate and the most negative available potential, thereby tying the substrate to this most negative potential or ground as is required for successful operation of the bipolar devices to be formed using this process.

Alternatives to the steps outlined herein may become apparent to a person of skill in the art who studies this invention disclosure. Therefore, the scope of this invention is to be limited only by the following claims.

What is claimed is:

1. A substrate tap and isolation trenches incorporated in an integrated circuit comprising a plurality of transistors formed in isolated device regions where transistors will be formed in a circuit material comprising a layer of N-type material over a layer of P-type substrate material;

said isolated device regions being defined by said isolation trenches, said isolation trenches having a width defined by an insolation trench bottom and isolation trench sidewalls, said isolation trenches surrounding said device regions and extending down through said N-type material into said P-type material;

said substrate tap comprising a region of said circuit material having a trench, said trench having a width defined by a trench bottom and trench sidewalls wider than said isolation trench width, said trench extending at least from said external surface of said N-type material distal to said P-type material, down through said N-type material, into said P-type material;

an oxide layer lining said sidewalls of said trench and said isolation trenches;

a first polysilicon layer covering said sidewalls and said bottom of said trench but not filling said trench, and filling said isolation trenches;

a second polysilicon layer formed in continuity with said first polysilicon layer in said trench; and a doped implant or diffused region, formed throughout said first polysilicon layer covering said sidewalls and said bottom in said trench in conductive contact with said P-type substrate material but insulated from said N-type material by said oxide layer, whereby a substrate tap is formed which extends between said P-type substrate material and said external surface of said N-type material;

means for connecting said doped implant or diffused region to a voltage potential to provide bias to said P-type substrate material.

2. The substrate tap and isolation trenches in claim 1 wherein said means for connecting said doped implant or diffused region to a voltage potential includes a silicide layer formed over said first polysilicon layer to enhance conductive contact to said doped implant or diffused region of said substrate tap.

3. The substrate tap and isolation trenches in claim 1 wherein said width of said trench which defines said substrate tap is at least twice as wide as said width of said isolation trenches.

4. An integrated circuit having at least one tub wherein transistors are formed comprising:

isolation trenches and at least one substrate tap, said substrate tap being formed simultaneously with said isolation trenches in a circuit material comprising a layer of P-type substrate material, a layer of N+ type material defining a buried layer on said P-type substrate and an N-type epitaxial layer over said buried layer, said N-type epitaxial layer having an external surface distal to said P-type substrate material;

said tubs being defined by said isolation trenches, said isolation trenches having a width defined by an insolation trench bottom and isolation trench sidewalls, said isolation trenches surrounding said tubs and extending down through said N-type epitaxial layer and said buried layer into said P-type material;

said substrate tap comprising a region of said circuit material having a trench, said trench having a width defined by a trench bottom and trench sidewalls wider than said isolation trench width, said trench extending at least from said external surface of said N-type epitaxial layer distal to said P-type material, down through said N-type epitaxial layer and said buried layer, into said P-type material;

an oxide layer lining said sidewalls of said trench and said isolation trenches;

a first polysilicon layer covering said sidewalls and said bottom of said trench but not filling said trench, and filling said isolation trenches;

a second polysilicon layer formed in continuity with said first polysilicon layer in said trench; and a doped implant or diffused region, formed throughout said first polysilicon layer covering said sidewalls and said bottom in said trench in conductive contact with said P-type substrate material but insulated from said N-type epitaxial layer and said buried layer by said oxide layer, whereby a substrate tap is formed which extends between said P-type substrate material and said external surface of said N-type epitaxial layer; and means for connecting said doped implant or diffused region to a voltage potential to provide bias to said P-type substrate material.

5. The integrated circuit in claim 4 wherein said means for connecting said doped implant or diffused region to a voltage potential includes a silicide layer formed over said first polysilicon layer to enhance conductive contact to said doped implant or diffused region of said substrate tap.

6. The integrated circuit in claim 4 wherein said width of said trench which defines said substrate tap is at least twice as wide as said width of said isolation trenches.

* * * * *

UNITED STATES PATENT AND TRADEMARK OFFICE
CERTIFICATE OF CORRECTION

PATENT NO. : 5,105,253

DATED : April 14, 1992

INVENTOR(S) : Larry J. Pollock

It is certified that error appears in the above-identified patent and that said Letters Patent is hereby corrected as shown below:

On the cover page before [45], change the last name of the inventor from "Polllock" to --Pollock--; and On the cover page after [75], change the last name of the inventor from "Polllock" to --Pollock--.

Signed and Sealed this

Sixth Day of July, 1993

Attest:

MICHAEL K. KIRK

Attesting Officer

Acting Commissioner of Patents and Trademarks